(12) United States Patent
Zhu et al.

(10) Patent No.: US 8,513,721 B2
(45) Date of Patent: Aug. 20, 2013

(54) CMOS IMAGE SENSOR WITH NON-CONTACT STRUCTURE

(75) Inventors: Hong Zhu, Shanghai (CN); Liwei Wu, Shanghai (CN); Jessy Xu, Shanghai (CN); Samuel Leng, Shanghai (CN); Celia Xin, Shanghai (CN); Jim Yang, Shanghai (CN)

(73) Assignees: Semiconductor Manufacturing International (Shanghai) Corporation, Shanghai (CN); Semiconductor Manufacturing International (Bejing) Corporation, Beijing (CN)

( * ) Notice: Subject to any disclaimer, the term of this patent is extended or adjusted under 35 U.S.C. 154(b) by 0 days.

(21) Appl. No.: 12/902,134

(22) Filed: Oct. 11, 2010

(65) Prior Publication Data

US 2012/0181589 A1 Jul. 19, 2012

(30) Foreign Application Priority Data

Oct. 20, 2009 (CN) .......................... 2009 1 0197450

(51) Int. Cl.
*H01L 31/062* (2012.01)
*H01L 31/113* (2006.01)
(52) U.S. Cl.
USPC .................. 257/292; 257/233; 257/E25.032; 438/129
(58) Field of Classification Search
USPC .................. 257/233, 292, E25.032; 438/129
See application file for complete search history.

(56) References Cited

U.S. PATENT DOCUMENTS

| | | | |
|---|---|---|---|
| 6,067,113 A * | 5/2000 | Hurwitz et al. | 348/241 |
| 6,534,356 B1 | 3/2003 | Yang et al. | |
| 6,654,057 B1 | 11/2003 | Rhodes | |
| 6,744,084 B2 * | 6/2004 | Fossum | 257/292 |
| 6,960,796 B2 * | 11/2005 | Rhodes et al. | 257/222 |
| 7,071,505 B2 * | 7/2006 | Rhodes | 257/292 |
| 7,078,746 B2 * | 7/2006 | Hong | 257/222 |
| 7,173,299 B1 * | 2/2007 | Drowley et al. | 257/291 |
| 7,224,389 B2 * | 5/2007 | Dierickx | 348/308 |
| 7,326,904 B2 * | 2/2008 | Fossum | 250/208.1 |
| 7,460,162 B2 * | 12/2008 | Koizumi et al. | 348/294 |
| 7,468,532 B2 * | 12/2008 | McKee | 257/292 |
| 7,719,590 B2 * | 5/2010 | Ellis-Monaghan et al. | 348/308 |
| 7,769,253 B2 * | 8/2010 | Imai et al. | 385/14 |
| 7,800,673 B2 * | 9/2010 | Sugawa et al. | 348/308 |
| 8,045,028 B1 * | 10/2011 | De Wit | 348/302 |

FOREIGN PATENT DOCUMENTS

CN 1819231 A 8/2006

* cited by examiner

*Primary Examiner* — Jarrett Stark
*Assistant Examiner* — Nicholas Tobergte
(74) *Attorney, Agent, or Firm* — Kilpatrick Townsend & Stockton LLP

(57) ABSTRACT

A complementary metal oxide semiconductor (CMOS) image sensor device includes a capacitive coupled photodiode that is formed within a region of a semiconductor substrate. The photodiode receives an incident light and generates a corresponding electric charge. The CMOS image sensor device includes a reset transistor coupled to the photodiode for reverse biasing the photodiode with a predetermined voltage. The CMOS image sensor device further includes a buffer circuit and a capacitor, which is interposed between the photodiode and the buffer circuit. The capacitor is configured to transfer the electric charge to the buffer circuit. The buffer circuit may include an emitter follower or a source follower transistor.

19 Claims, 3 Drawing Sheets

CMOS IMAGE SENSOR WITH NON-CONTACT STRUCTURE

BACKGROUND OF THE INVENTION

This application claims priority to Chinese Patent Application No. 200910197450.3, filed Oct. 20, 2009 in the People's Republic of China, commonly assigned herewith and incorporated in its entirety by reference herein for all purposes.

The present invention relates to a CMOS image sensor, and more particularly, to a CMOS imaging sensor using a capacitive coupled readout structure.

In general, a semiconductor based image sensor is a solid state imaging device having an array of pixel cells arranged in columns and rows. Each pixel cell includes at least a photo sensing element and other active components that convert an amount of incident light to an electrical (voltage or current) signal. Image sensors are classified into charge coupled devices (CCDs) and complementary metal oxide semiconductor (CMOS) image sensors (CISs). CCDs are often employed for image acquisition and enjoy a number of advantages, which makes it the incumbent technology, particularly for small size imaging applications. CCDs are also capable of large formats with small pixel size and they employ low noise charge domain processing techniques. However, CCD imagers also have limitations. For example, they are susceptible to radiation damage, they exhibit destructive read out over time, they require good light shielding to avoid image smear, and they have a high power dissipation for large arrays. Additionally, while offering high performance, CCD arrays are difficult to integrate with CMOS processing, in part due to a different processing technology and to their high capacitances, complicating the integration of on-chip drive and signal processing electronics with the CCD array. While there have been some attempts to integrate on-chip signal processing with the CCD array, these attempts have not been entirely successful. CCDs also transfer an image by line charge transfers from pixel to pixel, requiring that the entire array be read out into a memory before individual pixels or groups of pixels can be accessed and processed, which takes time. CCDs may also suffer from incomplete charge transfer from pixel to pixel during charge transfer, which also results in image smear.

Because of the inherent limitations in CCD technology, CMOS image sensors have become the technology of choice thanks to their capability of integrating advanced signal processing capabilities on the same die, thus simplifying the system design and reducing the overall system cost.

The advantages of CMOS image sensors over CCD imagers are that CMOS image sensors have a low voltage operation and low power consumption; CMOS image sensors are compatible with integrated on-chip electronics (control logic and timing, image processing, and signal conditioning such as A/D conversion); CMOS image sensors allow random access to the image data; and CMOS image sensors have lower fabrication costs as compared with the conventional CCD since standard CMOS processing techniques can be used. Additionally, low power consumption is achieved for CMOS image sensors because only one row of pixels at a time needs to be active during the readout and there is no charge transfer (and associated switching) from pixel to pixel during image acquisition. On-chip integration of electronics is particularly advantageous because of the potential to perform many signal conditioning functions in the digital domain (versus analog signal processing) as well as to achieve a reduction in system size and cost.

A CMOS image sensor circuit includes a focal plane array of pixel cells, each one of the cells including either a photodiode overlying a substrate for accumulating photo-generated charge in the underlying portion of the substrate. A readout circuit is connected to each pixel cell and includes at least an output field effect transistor formed in the substrate and a charge transfer section formed on the substrate adjacent the photodiode having a sensing node, typically a floating diffusion node, connected to the gate of an output transistor. The imager may include at least one electronic device such as a transistor for transferring charge from the underlying portion of the substrate to the floating diffusion node and one device, also typically a transistor, for resetting the node to a predetermined potential level prior to charge transfer.

CMOS image sensors are classified into 3T type, 4T type, and the like according to the number of transistors contained in a pixel cell. The 3T type CMOS image sensor includes one photodiode and three transistors, and the 4T type CMOS image sensor includes one photodiode and 4 transistors.

In a conventional CMOS image sensor, the elements of a pixel cell perform the necessary functions of: (1) photon to charge conversion; (2) accumulation of image charge; (3) transfer of charge to the floating diffusion node accompanied by charge amplification; (4) resetting the floating diffusion node to a known state before the transfer of charge to it; (5) selection of a pixel for readout; and (6) output and amplification of a signal, which is representative of the illumination level recorded at the pixel. The charge at the floating diffusion node is typically converted to a pixel output voltage by a source follower output transistor. The photosensitive element of a CMOS image sensor pixel is typically a depleted p-n junction photodiode. For photodiodes, image lag can be eliminated by completely depleting the photodiode upon readout. More detailed description of the CMOS image sensor is provided in U.S. Pat. No. 6,654,057 (Rhodes), which is incorporated herein by reference.

FIG. 1A is a layout of a 3T CMOS image sensor device 100 according to the prior art. The 3T CMOS image sensor device 100 includes a photodiode 102, an n+ floating diffusion region 103, a reset transistor 104, a source follower transistor 106, and a row select transistor 108. Contacts 114 and a conductive layer 115 couple photodiode 102, reset transistor 104, and source follower transistor 106. The n+ floating diffusion region 103 is interposed between the photodiode and the reset gate electrode of the reset transistor 104. The conductive layer 115 connects the n+ floating diffusion region 103 to the gate electrode of the source follower transistor.

FIG. 1B is a schematic diagram of a pixel cell 150, which is the electrical equivalent circuit of the 3T CMOS image sensor device 100 shown in FIG. 1A. The pixel cell 150 includes a photodiode 152 that receives incident light 153. The incident light generates electrons that are captured in the depletion capacitance of the reverse biased photodiode 152. The photodiode 152 is reversed biased by a reset transistor 154 to a predetermined reset voltage level 165. The reset transistor is controlled by a reset signal 155. The charge accumulated at the depletion capacitance of the photodiode at a node 160 changes the predetermined reset voltage. The voltage signal at node 160 is then buffered by a source follower transistor 156. The output of the source follower transistor is connected to a pixel select transistor 158 for reading out the voltage signal of the pixel cell at node 160. Pixel select transistor 158 is controller by a select signal 159. All pixel cells in a given column share a common signal bus output 167.

FIG. 1C is a partial cross-sectional view 170 of the 3T type CMOS image sensor layout shown in FIG. 1A. Photodiode 171 is formed by a N− doped region 172 and a P+ doped region 173 as known in the art. The n-type doped region 172 is defined by a mask and formed by implanting n-type dopants. N-type dopants such as arsenic, antimony, or phosphorous may be employed. The p-type doped region 173 is also formed by conducting a masked implantation with a dopant of p-type ions over the implanted n-type region 172. P-type dopants such as boron, beryllium, indium, or magnesium may be employed. An N+ doping diffusion 174 forms the floating diffusion region 174 (103 in FIG. 1A), which is then etched to form contact 150. In general, the contact in the floating diffusion (FD) area is a major source of dark current because of the damage that may be caused during the process of forming the contact. In order to provide the ohmic contact for the contact 150, an n+ region is formed on the area where the contact will be formed. The n+ region is formed by heavily implanting n-type dopants. This heavy implantation process can noticeably damage the silicon crystal of the substrate. The silicon crystal may also be damaged when a plasma etch process is performed to obtain a via opening for the contact. FIG. 1C shows the n+ doping induced crystal defects and also the contact etch induced crystal defects to the silicon crystal, and that the crystal defects cause an increase of the junction leakage. If the junction leakage is large, the floating diffusion region is not able to preserve an amount of charge from the photodiode, and the amount of charge may be lost even in the dark and results in a poor signal-noise ratio (SNR).

FIG. 2 is a simplified layout of a 4T CMOS image sensor device 200 according to the prior art. The 4T CMOS image sensor device 200 includes a photodiode 202, a transfer transistor 204, a reset transistor 206, a source follower transistor 208, and a row select transistor 210. The 4T CMOS image sensor device 200 uses the additional transfer transistor 204 to avoid having a contact in the photodiode, as in the case of the 3T CMOS image sensor device 100. By not having a contact in the photodiode, the 4T CMOS image sensor device generally provides better performance especially in the dark noise reduction over the 3T CMOS image sensor device. The transfer transistor serves to separate the photodiode from the potential sensing floating diffusion (FD) region.

Thus, a 4T CMOS image sensor device can reduce some of the junction leakage associated with the contact formation in the 3T CMOS image sensor device by not having to form a contact on the photodiode. However, this comes at the cost of an increase in the image sensor size because of the additional transfer transistor. It would be desirable to reduce the dark current and at the same time shrink the pixel cell size by reducing the number of active elements such as transistors.

BRIEF SUMMARY OF THE INVENTION

Embodiments of the present invention provide CMOS image sensor having a pixel cell structure that significantly reduces the dark noise and improves the overall signal-to-noise ratio of the CMOS image sensor. The implementation according to embodiments of the present invention is simple and can utilize standard CMOS process technology and does not increase the pixel cell size.

In an embodiment of the present invention, a complementary metal oxide semiconductor (CMOS) image sensor device includes a capacitive coupled photodiode that contains as anode an n− doped region formed within a region of a semiconductor substrate. The photodiode receives an incident light and generates a corresponding electric charge, which is collected in the n-doped region. The CMOS image sensor device also includes a reset transistor coupled to the photodiode for reverse biasing the photodiode with a predetermined voltage. The CMOS image sensor device further includes a capacitive element having a first conductive plate overlying a portion of the n− doped region of the photodiode and a second conductive plate. Additionally, the CMOS image sensor device includes a source follower transistor that is coupled to the photodiode via the capacitive element.

In an embodiment, the capacitive element further includes an insulation layer interposed between the first and second conductive plates. In a specific embodiment, the insulation layer includes an oxide formed at a same time as a gate dielectric layer of the reset and source follower transistors and has a thickness substantially equal to the thickness of the gate dielectric layer. In an embodiment, the first conductive plate comprises a dopant concentration of less than 10E18 ions per $cm^3$. In an embodiment, the second conductive plate comprises polysilicon that is formed at the same time as the gate electrodes of the reset transistor and the source follower transistor. In an embodiment, the second conductive plate is electrically coupled to a gate electrode of the source follower transistor.

In another embodiment, an image sensor device includes a photodiode that generates an electric charge from a received incident light. The image sensor device also includes a reset transistor that is coupled to the photodiode to reverse bias the photodiode with a predetermined voltage. The image sensor device further includes a buffer circuit and a capacitor that is interposed between the buffer circuit and the photodiode. The capacitor transfer the electric charge to the buffer circuit that provides at its output terminal a voltage signal that corresponds to the electric charge. In an embodiment, the buffer circuit includes a source follower transistor having a gate electrode electrically coupled to a top plate of the capacitor. The image sensor device may additionally include a select transistor coupled to the buffer circuit for reading out the voltage signal.

In an embodiment, the photodiode includes an n-type doped charge collection region overlying region of a p-type semiconductor substrate and a p+ doped region overlying the n-type doped charge collection region.

In an embodiment, the capacitor includes a bottom conductive plate coupled to the photodiode, a top conductive plate coupled to the gate electrode of the source follower transistor, and an insulation layer interposed between the bottom and top conductive plates. In an embodiment, the bottom conductive plate includes an n− lightly doped region overlying a surface of a portion of the n-type doped charge collection region. The n− lightly doped region has a concentration ranging from about $10^{15}$ to $10^{18}$ $ions/cm^3$. In an embodiment, the insulation layer includes a silicon oxide layer that may be formed simultaneously with the formation of the gate dielectric of the reset transistor and may have a thickness that is substantially equal to a thickness of the gate dielectric of the reset transistor. In an embodiment, the second conductive plate comprises a polysilicon layer that may be formed at the same time as the formation of a gate electrode of the reset transistor.

In yet an embodiment, the image sensor device may also include an interlayer dielectric layer overlying the top conductive plate and the gate electrodes of the reset transistor and the source follower transistor. A via structure is formed through the interlayer dielectric layer and in contact with the top conductive plate of the capacitor. The interlayer dielectric layer may include an oxide such as silicon oxide. The via structure may be filled with a conductive material such as metal to electrically connect the top plate of the capacitor with the gate electrode of the source follower transistor.

DETAILED DESCRIPTION OF THE INVENTION

Figure 1A:
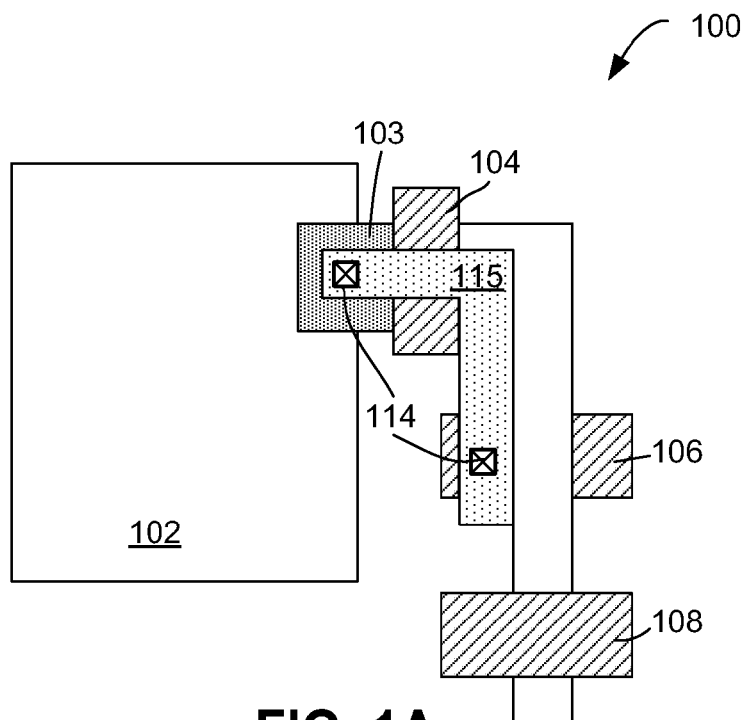
FIG. 1A is a top view of a 3T type CMOS image sensor according to the prior art.
Figure 1B:
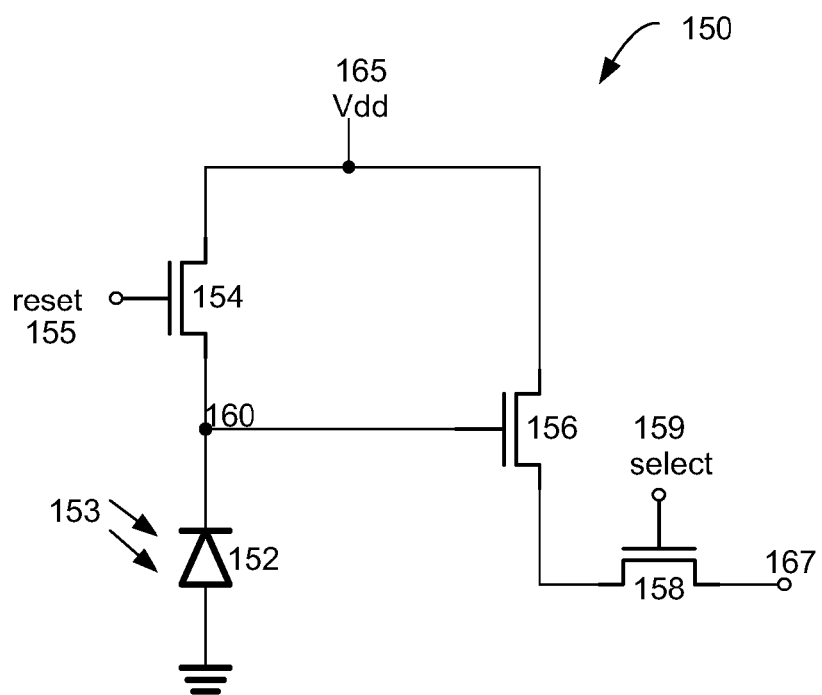
FIG. 1B is a schematic diagram of the 3T type CMOS image sensor of the prior art shown in FIG. 1A.
Figure 1C:
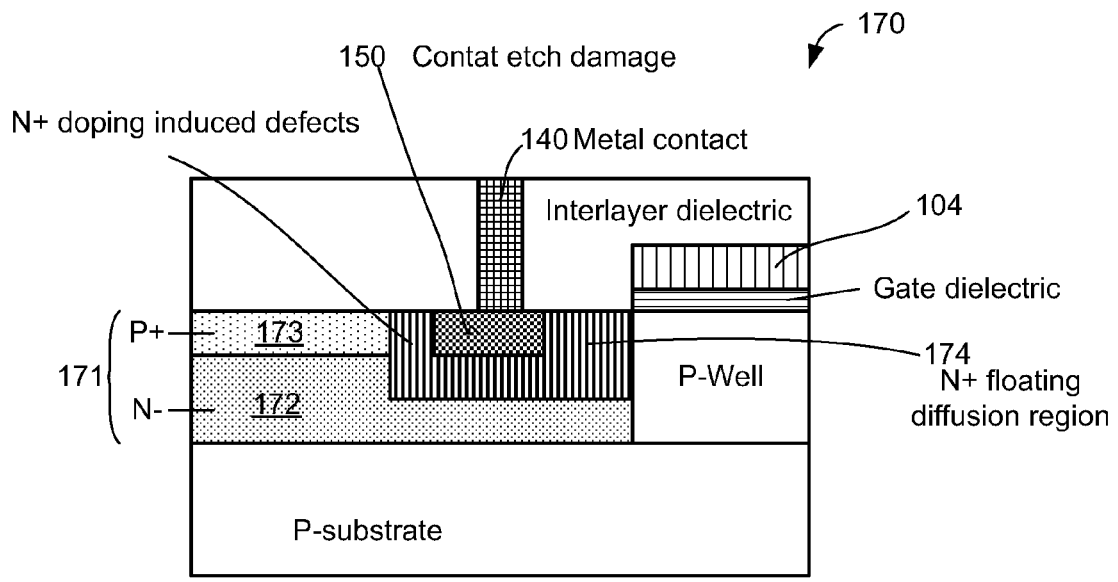
FIG. 1C is a cross-sectional view of the 3T type CMOS image sensor of the prior art shown in FIG. 1A.
Figure 2:
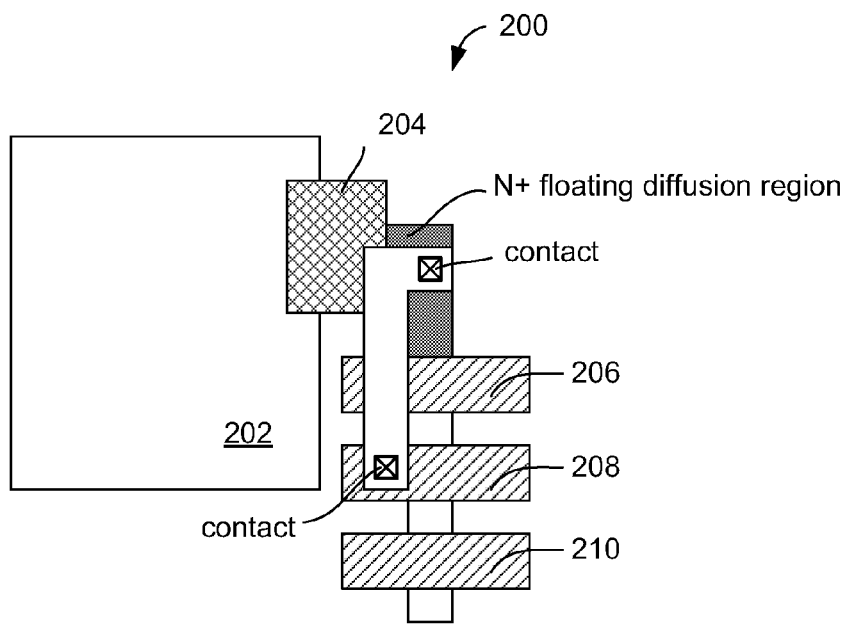
FIG. 2 is a 4T type CMOS image sensor according to the prior art.
Figure 3:
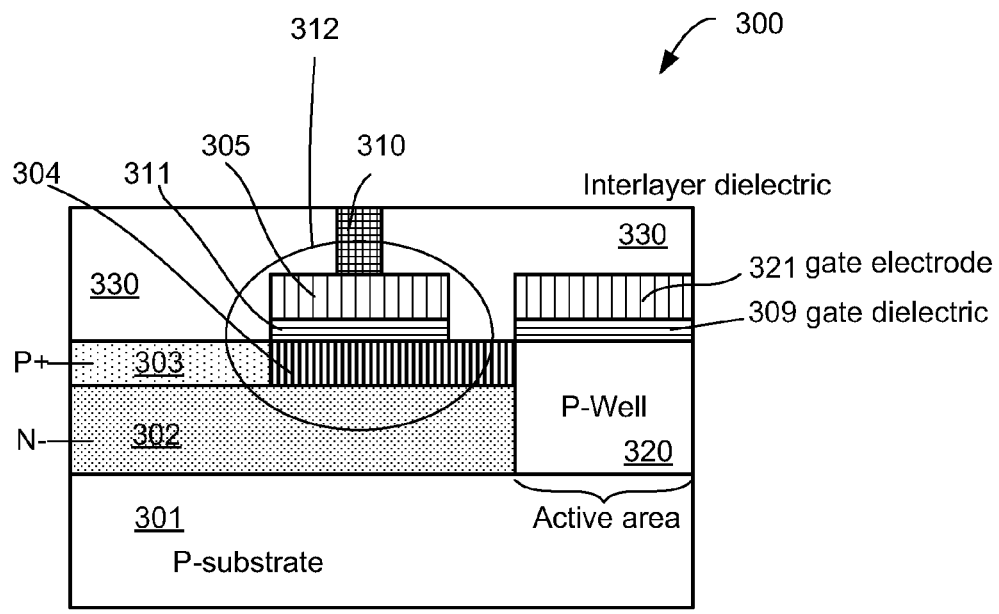
FIG. 3 is a cross-sectional view of a CMOS image sensor according to one embodiment of the present invention.

FIG. 3 illustrates a cross-sectional view of a CMOS image sensor device 300 according to an embodiment of the present invention. The CMOS image sensor device 300 includes a photodiode having an n– doped region 302 and a p+ doped region 303. The n-type doped region 302 may be defined by a mask and formed by implanting n-type dopants onto a region of a P-substrate 301. N-type dopants such as arsenic, antimony, or phosphorous may be employed. The P-type doped region 303 may be formed by conducting a masked implantation with p-type ions over the implanted n– region 302. P-type dopants such as boron, beryllium, indium, or magnesium may be employed. The doped regions 302 and 303 thus form a p-n photodiode that generates an electric charge when receiving an incident light. The CMOS image sensor further includes a capacitive coupling structure 312 that includes an n– doped region 304 as a bottom plate and a conductive layer 305 as a top plate. Capacitive coupling structure 312 also includes an insulation layer 311 interposed between the n– doped region that form the bottom plate 304 and the conductive layer that forms the top plate 305. The capacitive coupling structure thus forms a capacitor. In an embodiment, the conductive layer 305 comprises a polysilicon material.

Referring to FIG. 3, a P-well region 320 is formed overlying the P-substrate 301 in which an active area is defined. A gate dielectric 309 is overlying the active area of the p-substrate. A gate electrode 321 is formed on the gate dielectric 309. In an embodiment, the gate electrode 321 controls a gate of a transistor of a 3T type or a 4T type CMOS image sensor.

In an embodiment, an interlayer dielectric layer 330 is overlying the gate electrode and the capacitive coupling structure. A via is formed through the interlayer dielectric layer and is filled with a metal to form a contact 310, which is electrically connected to the top conductive plate 305 of the capacitive coupling structure. A second conductive layer (not shown) may be formed overlying the interlayer dielectric layer 330 and the metal contact 310 to electrically connect the top plate 305 with a gate electrode of a source follower transistor (not shown).

The charge of the photodiode of the CMOS image sensor device 300 can thus, be capacitive coupled to an active component such as the source follower transistor in a 3T type CMOS image sensor device or to a transfer transistor in a 4T type CMOS image sensor device according to embodiments of the present invention.

The CMOS image sensor device 300 according to the present invention eliminates three major sources of junction leakage associated with a direct ohmic contact structure of the prior art: 1) n+ doping, 2) contact etch, 3) metal deposition and annealing. Thus, the heavy implantation process associated with the formation of the N+ region that cause midgap defects resulting from the damage to the crystal lattice and non-activated dopants is eliminated. The plasma etch process that can damage the silicon surface and a region below the silicon surface specially when the etching process is not well controlled is also eliminated. The direct metal deposition on the silicon substrate and subsequent annealing of the metal that may damage the silicon is also eliminated. Thus, the inventive capacitive coupling structure 312 avoids those three processes that may cause an increase in dark current.

In an embodiment of the present invention, the lightly n– doped region 304 has a doping concentration ranging from about $10^{15}$ to about $10^{18}$ ions/cm$^3$. The doping concentration of the n– region is higher than the doping concentration in the p-type substrate, but substantially less than the conventional n+ region, which has a typical doping concentration of more than $10^{20}$ ions/cm$^3$. In an embodiment, the insulation layer 311 is formed simultaneously with the gate dielectric layer 321 in the active region. In an embodiment, the insulation layer 311 has a thickness substantially equal to the thickness of the dielectric layer 311. The insulation layer 311 may include a silicon oxide and having a thickness the same as the thickness of the gate oxide 309 of the active components, e.g. the reset transistor, the source follower transistors and the select transistor of a 3T type or a 4T type CMOS image sensor device. In another embodiment, the dielectric layer 311 may have a different thickness than the thickness of the gate dielectric of the transistors.

In an embodiment, the top conductive plate 305 of the capacitive coupling structure is coplanar with the gate electrode layer 321 and can be formed simultaneously with the formation of the gate electrode on the active region.

In an embodiment, the top conductive plate 305 of the capacitive coupling structure comprises polysilicon having a thickness that is substantially equal to the thickness of the polysilicon layer 321. The polysilicon layer may be patterned as a physical connection to electrically connect the top plate of the capacitive coupling structure 312 with a gate electrode of the source follower transistor. Alternatively, a contact, e.g., a metal line, overlying the interlayer dielectric layer 330 may be used to connect the top plate of the capacitive coupling structure to the gate electrode of the source follower transistor. In either case, the plasma etch step of the prior art for forming a via (or contact opening) to the silicon surface of the photodiode is not required. If the dielectric oxide layer is thermally grown, the thermal process will provide a passivation effect of the silicon surface (i.e., a damaged crystal can be repaired). In addition, the effects of damage to the silicon can be reduced when using the lightly doped N– region 304 rather than the heavily-doped n+ region as in the prior art.

Figure 4:
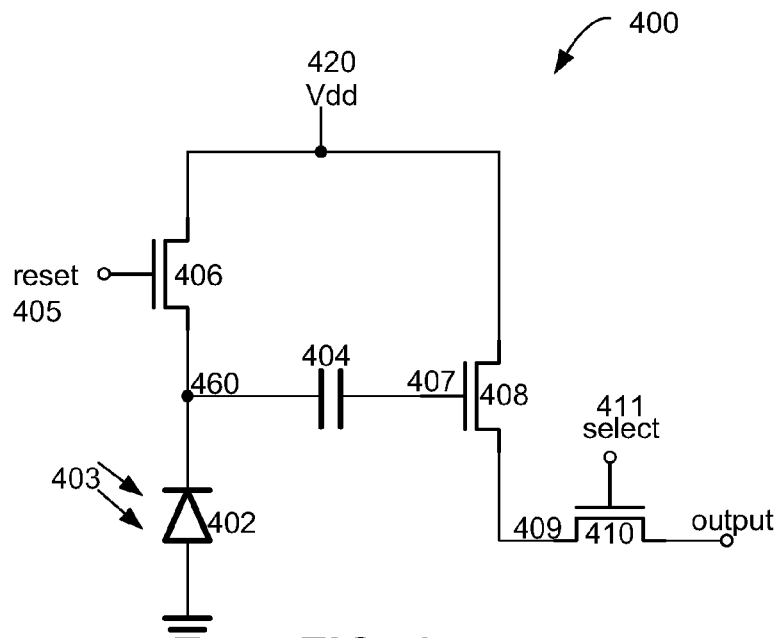
FIG. 4 is a schematic diagram of the CMOS image sensor shown in FIG. 3 according to an embodiment of the present invention.

FIG. 4 a schematic diagram of a CMOS image sensor circuit 400 according to one embodiment of the present invention. The CMOS image sensor circuit 400 includes a photodiode 402 that receives an incident light 403 and generates a corresponding current. Photodiode 402 is reversed biased by being set with a predetermined voltage 420 through a reset transistor 405. Photodiode 402 converts the incident light to electrons that are then stored in the np junction of the photodiode. The light-generated electrons define an electric charge that is a function of the incident light intensity. The charge is then passed through the coupling capacitor 404 and applied to a gate electrode 407 of a source follower transistor 408, which amplifies (buffers) the charge as a buffered voltage at node 409. The buffered voltage at node 409 is then read out by a select transistor 410 that is controlled by a select signal 411.

It is understood that the examples and embodiments described herein are for illustrative purposes only and that various modifications and alternations in light thereof will be

What is claimed is:

1. A complementary metal oxide semiconductor (CMOS) image sensor device including a capacitive coupled photodiode, the CMOS image sensing device comprising:
   the photodiode configured to receive an incident light and generate an electric charge, the photodiode having an n-type doped region formed within a region of a semiconductor substrate, the n-type doped region configured to collect the generated electric charge;
   a reset transistor coupled to the photodiode configured to reverse bias the photodiode with a predetermined voltage;
   a capacitive element having a first plate overlying a portion of the n-type doped region and a second plate; and
   a source follower transistor coupled to the second plate.

2. The CMOS image sensor device of claim 1, wherein the capacitive element further comprises an insulation layer interposed between the first plate and the second plate.

3. The CMOS image sensor device of claim 2, wherein the insulation layer comprises an oxide.

4. The CMOS image sensor device of claim 2, wherein the insulation layer is a gate dielectric layer having a thickness substantially equal to a gate dielectric thickness of the reset transistor.

5. The CMOS image sensor device of claim 1, wherein the first plate comprises a N− lightly doped region having a dopant concentration of less than 1018 ions/cm$^3$.

6. The CMOS image sensor device of claim 1, wherein the second plate is electrically coupled to a gate electrode of the source follower transistor.

7. The CMOS image sensor device of claim 1, wherein the second plate comprises polysilicon.

8. The CMOS image sensor device of claim 7, wherein the second plate is coplanar with the gate electrode of the source follower transistor.

9. The CMOS image sensor device of claim 1, further comprising a select transistor coupled to the source follower transistor.

10. An image sensor device comprising:
    a photodiode configured to generate an electric charge from an incident light;
    a reset transistor coupled to the photodiode and being configured to reverse bias the photodiode with a predetermined voltage;
    a buffer circuit; and
    a capacitor having a first terminal connected to the photodiode and a second terminal connected to the buffer circuit, the capacitor being configured to transfer the electric charge to the buffer circuit.

11. The image sensor device of claim 10, where the buffer circuit comprises a source follower transistor.

12. The image sensor device of claim 10, further comprising a select transistor coupled to the buffer circuit.

13. The image sensor device of claim 10, where the photodiode comprises:
    an n-type doped charge collection region overlying a p-type semiconductor substrate; and
    a p+ doped region overlying the n-type doped charge collection region.

14. The image sensor device of claim 10, where the capacitor comprises:
    a first plate coupled to the photodiode;
    a second plate coupled to a gate electrode of the buffer circuit; and
    an insulation layer interposed between the first plate and the second plate.

15. The image sensor device of claim 14, wherein the first plate comprises a N− lightly doped region overlying the n-type doped charge collection region of the photodiode.

16. The image sensor device of claim 15, wherein the N− lightly doped region comprises a concentration of less than 1018 ions/cm$^3$.

17. The image sensor device of claim 14, wherein the second plate comprises polysilicon.

18. The image sensor device of claim 17, wherein the second plate is coplanar with a gate electrode of the reset transistor.

19. The image sensor device of claim 14, wherein the insulation layer comprises oxide having a thickness substantially equal to a gate dielectric thickness of the reset transistor.

* * * * *